United States Patent
Tanaka et al.

[11] Patent Number: 5,629,268
[45] Date of Patent: May 13, 1997

[54] PROCESS FOR PREPARING A LAYERED SUPERCONDUCTING STRUCTURE

[75] Inventors: So Tanaka; Takao Nakamura; Michitomo Iiyama, all of Osaka, Japan

[73] Assignee: Sumitomo Electric Industries, Ltd., Osaka, Japan

[21] Appl. No.: 457,313

[22] Filed: Jun. 1, 1995

Related U.S. Application Data

[63] Continuation of Ser. No. 261,309, Jun. 16, 1994, abandoned, which is a continuation of Ser. No. 858,420, Mar. 27, 1992, abandoned.

[30] Foreign Application Priority Data

Mar. 28, 1991 [JP] Japan .................. 3-089620
Mar. 28, 1991 [JP] Japan .................. 3-089621

[51] Int. Cl.$^6$ .................. H01L 39/24; B05D 5/12
[52] U.S. Cl. .................. 505/329; 505/473; 505/475; 505/702; 505/731; 505/732; 505/236; 505/238; 427/62; 427/419.3
[58] Field of Search .................. 505/329, 473, 505/475, 702, 731, 732, 236, 238; 427/62, 63, 126.3, 314, 419.2, 419.3

[56] References Cited

U.S. PATENT DOCUMENTS

| | | | |
|---|---|---|---|
| 5,061,687 | 10/1991 | Takada et al. | 505/1 |
| 5,087,605 | 2/1992 | Hegde et al. | 505/1 |

FOREIGN PATENT DOCUMENTS

| | | |
|---|---|---|
| 0299870 | 1/1989 | European Pat. Off. |
| 0366949 | 5/1990 | European Pat. Off. |
| 0467777 | 1/1992 | European Pat. Off. |

OTHER PUBLICATIONS

Patent Abstracts of Japan, vol. 13, No. 346 (E-798) 3 Aug. 1989; & JP-A-11 06 481 (Fujitsu).

IEEE Transactions On Magnetics, vol. 27, No. 2, Mar. 1991, New York, US pp. 1361-1364, Sakuta K. et al, "Microscopic Observation of interface structures of YBaCuO/MgO/YBaCuO double-heteroepitaxial thin films by TEM" & Applied Superconductivity Conference 24 Sep. 1990, Snowmass, US.

Harris et al, Solid State Communications, vol. 67, No. 4 1988, pp. 359-362.

Sobolewski et al, "Cleaning Of $YBa_2Cu_3O_{7-x}$ surfaces by thermal Oxidation Treatments", AIP No. 200 (Boston, MA) 1989 pp. 197-204.

Ohara et al, "Atmospheric deterioration of clean surface of epitaxial (001)-YBaCuO Films studied by low-energy electron diffraction" Jpn. J. Appl. Phys. 30(12B) Dec. 1991, pp. L2085-2087.

Rogers et al, "Fabrication of heteroepitaxial $YBa_2Cu_3O_{7-x}$—$PrBa_2Cu_3O_{7-x}$—$YBa_2Cu_3O_{7-x}$ Josephson device grown by laser deposition", Appl. Phys. lett. 55(19) Nov. 1989 pp. 2032-2034.

(List continued on next page.)

*Primary Examiner*—Roy V. King
*Attorney, Agent, or Firm*—Kerkam, Stowell, Kondracki & Clarke, P.C.; John C. Kerins

[57] ABSTRACT

A process for depositing successively a plurality of thin films on a bottom superconductor layer made of oxide superconductor deposited on a substrate in a single chamber under a condition, the bottom superconductor layer is heated in ultra-high vacuum at a temperature which is lower than the oxygen-trap temperature ($T_{trap}$) at which oxygen enter into the oxide superconductor but higher than a temperature which is lower by 100° C. than the oxygen-trap temperature ($T_{trap}$−100° C.) and then the first thin film is deposited thereon.

18 Claims, 1 Drawing Sheet

OTHER PUBLICATIONS

Mizuno et al, "Fabrication of thin-film-type Josephson junctions using a $B_i$—$S_r$—$C_a$—$C_u$—O/$B_i$—$S_r C_u$—O/$B_i$—$S_r$—$C_a$—$C_u$—O structure," Appl. Phys. lett. 56(15) Apr., 1990, pp. 1469–1471.

Kiryakov et al, "Investigation of the gas evolution from high-Tc superconductivity ceramic Y—$B_a$—$C_u$—O heat treated in vacuum", Superconductivity vol. 3, No. 6 Jun. 1990, pp. 1057–1064.

PROCESS FOR PREPARING A LAYERED SUPERCONDUCTING STRUCTURE

This is a continuation of application Ser. No. 08/261,309 filed Jun. 16, 1994 which is a continuation of 07/858,420 filed Mar. 27, 1992.

BACKGROUND OF THE INVENTION

1. Field of the Invention

The present invention relates to a process for preparing layered thin films, more particularly, it relates to a process for depositing a plurality of thin films including a bottom superconductor layer on a substrate successively to produce a layered superconducting structure.

2. Description of the Related Art

Oxide superconductors are expected to be used in a variety of applications due to their higher critical temperatures than conventional metal superconductors. In fact, Y—Ba—Cu—O oxide superconductor possess the critical temperature above 80K and Bi—Sr—Ca—Cu—O and Tl—Ba—Ca—Cu—O oxide superconductors possess that of above 100K.

When the oxide superconductors are used in superconducting devices, it is indispensable to prepare a thin film of oxide superconductor and to laminate a plurality thin films including a bottom superconductor layer successively on a substrate. For example, in a superconducting junction so-called tunnel type Josephson Junction realized with oxide superconductor, it is requested to deposit a bottom superconductor layer, an intermediate layer of non-superconductor and a top superconductor layer on a substrate successively in this order.

Josephson element is a two-terminals element, so that a logical circuit consisting of Josephson elements alone becomes complicated. In order to overcome this demerit of complexity, a variety of ideas of three-terminals elements are proposed. In the superconductor transistors consisting of superconductor and semiconductor which is a typical three-terminals element, it is also required to combine a thin film of semiconductor with a thin film of oxide superconductor and hence successive deposition of thin films each consisting of different material is required.

Successive deposition of a thin film of ordinary conductor such as metal onto a thin film of oxide superconductor is required also in the other type superconducting element consisting of superconductor and ordinary conductor.

In these superconducting elements, a superconducting current passes through a thin film of non-superconductor sandwiched between two adjacent layers of superconductors positioned close to each other. A distance between the two adjacent superconductors is determined by the coherence length of superconductor. Since the coherence length of oxide superconductors is very short, the distance between two adjacent superconductors must be several nanometer.

In addition to this, from a point of view as performance of the superconducting devices, all thin films in the superconducting device must have high crystallinity, in other words, these thin films are made preferably of a single crystal or polycrystal having crystal orientation which is similar to single crystal. When the superconducting device has thin film(s) made of polycrystal whose crystal orientation is not well-ordered or has amorphous thin film(s), high-performance of the superconducting device can not be expected and hence function thereof become unstable.

When a plurality of thin film of oxide superconductors are deposited successively on a common substrate, it is usual practice to subject a surface of a bottom superconductor layer to cleaning operation before a top superconductor layer is deposited, otherwise electrical continuity between the bottom superconductor layer and the top superconductor layer is spoiled due to contaminants adsorbed on a surface of the bottom superconductor layer or undesirable oxides produced on the surface. Discontinuity of two layers result in formation of an undesirable junction between two layers. Superconducting devices or integrated superconducting circuits having such undersirable junction do not show desired performance and sometimes do not work.

In particular, the surface condition of the bottom superconductor layer should be considered carefully because the coherence length of oxide superconductors is very short and hence the superconductivity is easily lost. Therefore, the surface of bottom superconductor layer must be clean and also must have well-ordered crystallinity or superconducting property.

In the field of semiconductor industries, surfaces are cleaned with ultra-pure water, by chemical washing, dry or wet etching or the like. In the case of oxide superconductors, however, these clearing techniques can not be used due to high reactivity of oxide superconductors. If the surface of thin film of oxide superconductor is treated by these known techniques, undesirable reaction occur on the surface, resulting in that cleanness of the surface become worse and crystallinity and superconducting property are lost.

Under certain film forming materials and conditions, constituent elements of the top superconductor layer diffuse or migrate into the bottom superconductor layer, resulting in that an interface between these layers becomes unclear and thin films of oxide superconductor are deteriorated.

An object of the present invention is to solve the problems and to provide a process for preparing layered thin films comprising a bottom superconductor layer and the other thin film layers deposited on the bottom superconductor layer and having improved crystallinity and continuity especially at superconducting interfaces.

SUMMARY OF THE INVENTION

The present invention provides a process for depositing successively a plurality of thin films on a bottom superconductor layer made of oxide superconductor deposited on a substrate, characterized in that deposition of all of the bottom superconductor layer and the thin films is carried out in a single chamber successively.

The deposition is carried out preferably under one of following conditions (1) and (2):

(1) Deposition of a first thin film to be deposited directly on the bottom superconductor layer is effected under such condition that the bottom superconductor layer is heated above the oxygen-trap temperature ($T_{trap}$) at which oxygen enter into the oxide superconductor but lower than the film forming temperature of the bottom superconductor layer.

(2) The bottom superconductor layer is heated in a ultra-high vacuum chamber at a temperature lower than the oxygen-trap temperature ($T_{trap}$) but higher than a temperature which is lower by 100° C. than the oxygen-trap temperature ($T_{trap}-100°$ C.), and then the first thin film is deposited on the bottom superconductor layer.

The oxygen-trap temperature ($T_{trap}$) and the film forming temperature are known for respective oxide superconductor.

The process according to the present invention is applicable to any known oxide superconductors and is advantageously applicable to Y—Ba—Cu—O oxide superconductor, Bi—Sr—Ca—Cu—O oxide superconductor and Tl—Ba—Ca—Cu—O oxide superconductor which have the most attractive properties including their high critical temperatures.

The substrate is preferably a single crystal of oxide such as MgO, SrTiO$_3$, PrGaO$_3$ or the like.

According to the present invention, a layered structure containing at least one thin film of oxide superconductor of high quality can be produced under one of the conditions (1) and (2).

Preferably, in both conditions (1) and (2), deposition of the bottom and top superconductor layers and an oxygen-containing thin film to be deposited on the bottom superconductor layer is carried out in an atmosphere of oxygen having the purity of higher than 5N (99.999%). Existence of H$_2$O and CO$_2$ in oxygen deteriorate the oxide, superconductor because they react easily with the oxide superconductor so that H$_2$O and CO$_2$ should be eliminated as small as possible.

In a preferred embodiment, the bottom superconductor layer is a c-axis oriented thin film of Y$_1$Ba$_2$Cu$_3$O$_{7-x}$, the first thin film is made of non-superconductor, for example oxide such as MgO or metal such as Ag and a second thin film to be deposited on the first thin film is a top superconductor layer of Y$_1$Ba$_2$Cu$_3$O$_{7-x}$. In this preferred embodiment, deposition of all thin films to be deposited on the bottom superconductor layer is effected at a substrate temperature between 400° and 600° C. under the deposition of condition (1), and the bottom superconductor layer is heated in ultra-high vacuum of lower than 1×10$^{-9}$ Torr at the substrate temperature between 350° and 400° C. before the first thin film is deposited under the condition (2).

When deposition of the first thin film is carried out in the temperature range defined by the condition (1), enough oxygen enter into the oxide superconductor and diffusion of constituent elements of the first thin film into the bottom superconductor layer can be prevented effectively. For example, when the bottom superconductor layer is a thin film of Y—Ba—Cu—O oxide superconductor, the first thin film of MgO or Ag is deposited at the substrate temperature between 400° and 600° C.

When deposition of the first thin film is carried out in the temperature range defined by the condition (2), oxygen do not escape out of the bottom superconductor layer and constituent elements of the thin film deposited directly on the bottom superconductor layer do not diffuse or migrate into the bottom superconductor layer. For example, when the bottom superconductor layer is a thin film of Y—Ba—Cu—O oxide superconductor, the first thin film of MgO or Ag is deposited at the substrate temperature between 350° and 400° C.

In both conditions (1) and (2), all thin films to be deposited on the bottom superconductor layer should not be deposited above the film forming temperature at which the bottom superconductor layer has been deposited.

The process according to the present invention characterized by the condition (1) and (2) is useful for fabricating a superconducting element comprising a bottom superconductor layer, an intermediate layer made of insulator or ordinary conductor and a top superconductor layer having a different crystal orientation.

In the process according to the present invention, all layers of bottom superconductor layer and thin films deposited thereon must be produced successively in a single chamber so that the bottom superconductor layer does not contact with air and hence a surface of the bottom superconductor layer is neither contaminated nor deteriorated by a reaction with moisture in air.

The stratified thin films prepared by the process according to the present invention show improved crystallinity and continuity especially at superconducting interfaces which are requested for realizing superconducting elements or integrated superconducting circuits so that high-performance superconducting systems can be realized.

BRIEF DESCRIPTION OF THE DRAWING

FIG. 1A shows a substrate (5) on which thin films are to be deposited successively by the process according to the present invention.

Figure 1A:
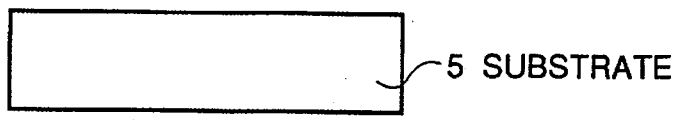
FIGS. 1A, 1B, 1C and 1D illustrate successive steps for preparing a layered structure containing at least one thin film of oxide superconductor by the process according to the present invention.
Figure 1B:
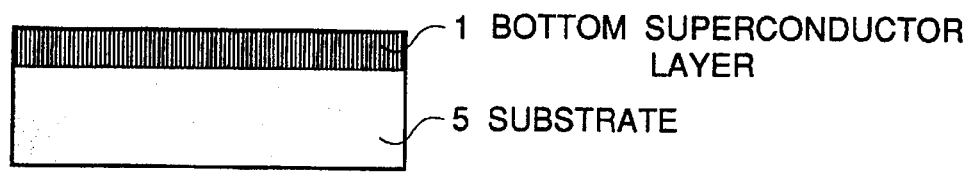

At first, a bottom superconductor layer (1) is deposited on the substrate (5) preferably in an atmosphere of high-pure oxygen by off-axis sputtering method, laser abrasion method, reaction evaporation method, MBE or CVD technique (FIG. 1B).

In the condition (2) of the present invention, the chamber is evacuated under a background pressure of lower than 1×10$^{-9}$ Torr and the temperature of bottom superconductor layer (1) is adjusted within the range determined by the present invention.

Figure 1C:
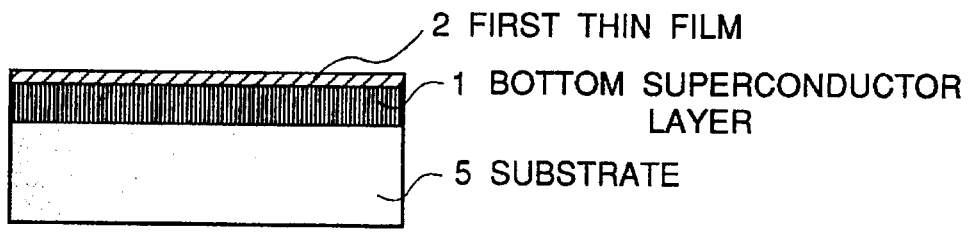

In the same sputtering chamber, a first thin film (2) such as a thin film of MgO or Ag is deposited by sputtering method, laser abrasion method, evaporation method, MBE or CVD technique or the like (FIG. 1C) under the conditions determined by the present invention.

Figure 1D:
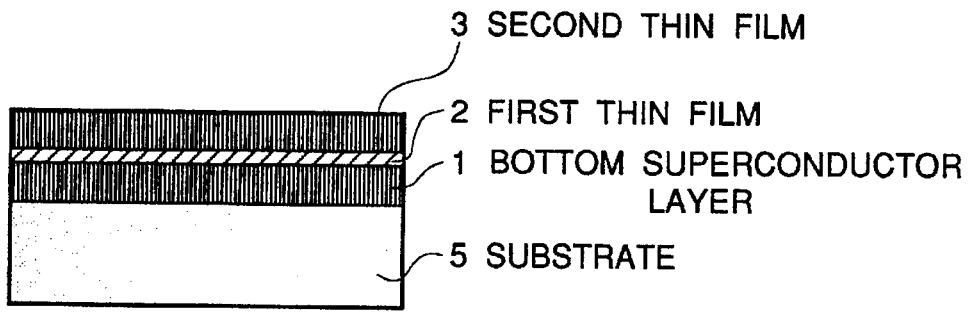

Finally, in the same sputtering chamber, a second thin film (3) such as a top superconductor layer is deposited by off-axis sputtering method, laser abrasion method, reaction evaporation method, MBE or CVD technique (FIG. 1D) under the conditions determined by the present invention.

DESCRIPTION OF THE PREFERRED EMBODIMENT

Now, the present invention will be described with referring to Examples but the scope of the invention should not be limited thereto.

EXAMPLE 1

(Condition 1)

In this Example 1, three-layered thin films of a bottom superconductor layer of Y$_1$Ba$_2$Cu$_3$O$_{7-x}$, an intermediate MgO layer and a top superconductor layer of Y$_1$Ba$_2$Cu$_3$O$_{7-x}$ are deposited successively on a substrate of MgO(100) under the condition (1) of the process according to the present invention whose steps are illustrated in FIG. 1.

At first, a substrate (5) of MgO (100) is placed in a ultra-high vacuum chamber which is then evacuated to 1×10$^{-9}$ Torr.

Then, high pure oxygen having a purity of 99.999% and argon gas are introduced in the ultra-high vacuum chamber and a thin film of c-axis oriented thin film of oxide superconductor of Y$_1$Ba$_2$Cu$_3$O$_{7-x}$ (1) having a thickness of 300 nm is deposited on the substrate (5) of MgO (100) by off-axis sputtering method under following operational conditions(FIG. 1B):

Sputtering gas Ar: 90%

O$_2$:10%

Pressure: 10 Pa

Substrate temperature: 700° C.

After deposition is complete, the substrate temperature is lowered to 500° C. After that, a thin film of MgO is deposited up to a thickness of 2 nm by evaporation method under following conditions (FIG. 1C):

Atmosphere Ar: 90%

$O_2$:10%

Pressure: 10 Pa

Then, a thin film of oxide superconductor of $Y_1Ba_2Cu_3O_{7-x}$ (3) having a thickness of 200 nm is deposited on the resulting thin film of MgO (2). Deposition of this top superconductor layer (3) can be carried out by the same method as above but the substrate temperature must be adjusted in a range between 400° and 600° C. The off-axis sputtering is carried out under following operational conditions:

Sputtering gas Ar: 90%

$O_2$:10%

Pressure: 10 Pa

Substrate temperature: 570° C.

All procedures are carried out in a single chamber successively. It is confirmed that three layers prepared by the process according to the present invention possess improved crystallinity and continuity especially at superconducting interfaces.

EXAMPLE 2

(Condition 1)

Example 1 is repeated but the MgO thin film is replaced by a thin film of Ag of the same thickness.

In this Example 2, after deposition is complete, the substrate temperature is lowered to 500° C. and then a thin film of Ag is deposited up to a thickness of 10 nm without oxygen by evaporation method under following conditions:

Atmosphere Ar: 100%

Pressure: 10 Pa

Then, the substrate temperature is adjusted at 570° C. and a second thin film of oxide superconductor of $Y_1Ba_2Cu_3O_{7-x}$ (3) having a thickness of 200 nm is deposited on the resulting thin film of Ag by off-axis sputtering under the same operational conditions as Example 1.

All procedures are carried out in a single chamber successively. It is confirmed that three layers prepared by the process according to the present invention possess improved crystallinity and continuity especially at superconducting interfaces.

EXAMPLE 3

(Condition 2)

In this Example 3 also, three-layered thin films of a bottom superconductor layer of $Y_1Ba_2Cu_3O_{7-x}$, an intermediate MgO layer and a top superconductor layer of $Y_1Ba_2Cu_3O_{7-x}$ are deposited successively on a substrate of MgO(100) by the condition (2) of the process according to the present invention whose steps are illustrated in FIG. 1.

At first, a substrate (5) MgO (100) is placed in a ultra-high vacuum chamber which is then evacuated to $1\times10^{-9}$ Torr.

Then, high pure oxygen having a purity of 99.999% and argon gas are introduced in the ultra-high vacuum chamber and a thin film of c-axis oriented thin film of oxide superconductor of $Y_1Ba_2Cu_3O_{7-x}$ (1) having a thickness of 300 nm is deposited on the substrate (5) of MgO (100) by off-axis sputtering method under following operational conditions(FIG. 1B):

Sputtering gas Ar: 90%

$O_2$:10%

Pressure: 10 Pa

Substrate temperature: 700° C.

After deposition is complete, the substrate temperature is lowered to 400° C. in order that oxygen is adsorbed in oxide superconductor.

After this heat-treatment complete, the substrate temperature is lowered down to 370° C. and the ultra-high vacuum chamber is again evacuated to $1\times10^{-9}$ Torr. At the temperature of 370° C., oxygen do not escape out of the oxide superconductor.

Then, high pure oxygen having a purity of 99.999% and argon gas are introduced again in the ultra-high vacuum chamber. After that, the substrate temperature is elevated to 375° C. and a thin film of MgO is deposited up to a thickness of 10 nm by sputtering method under following conditions (FIG. 1C):

Atmosphere Ar: 90%

$O_2$: 10%

Pressure: 10 Pa

Then, a thin film of oxide superconductor of $Y_1Ba_2Cu_3O_{7-x}$ (3) having a thickness of 200 nm is deposited on the resulting thin film of MgO (2). Deposition of this top superconductor layer (3) can be effected by any method. For example, in the case of off-axis sputtering, following operational conditions can be used:

Sputtering gas Ar: 90%

$O_2$: 10%

Pressure: 10 Pa

Substrate temperature: 700° C.

All procedures are carried out in a single chamber successively. It is confirmed that three layers prepared by the process according to the present invention possess improved crystallinity and continuity at interfaces between two adjacent layers.

EXAMPLE 4

(Condition 2)

Example 3 is repeated but the MgO thin film is replaced by a thin film of Ag of the same thickness.

In this Example 3, after the substrate temperature is adjusted at 370° C., a thin film of Ag is deposited up to a thickness of 20 nm without oxygen by evaporation method under following conditions:

Atmosphere Ar: 100%

Pressure: 10 Pa

Then, the substrate temperature is elevated to 700° C. and a second thin film of oxide superconductor of $Y_1Ba_2Cu_3O_{7-x}$ (3) having a thickness of 200 nm is deposited on the resulting thin film of Ag by off-axis sputtering under the same operational conditions as Example 1.

All procedures are carried out in a single chamber successively. It is confirmed that three layers prepared by the process according to the present invention possess improved crystallinity and continuity especially at superconducting interfaces.

We claim:

1. A process for depositing successively a plurality of films on a bottom superconductor layer made of a $YBa_2Cu_3$ oxide superconductor deposited on a substrate, wherein the deposition of said films is carried out in a single chamber successively, and wherein the deposition of a first film to be deposited directly on said bottom $YBa_2Cu_3$oxide superconductor layer is carried out under a condition wherein:

said bottom superconductor layer is heated in an ultra-high vacuum of lower than $1\times10^{-9}$ Torr, at a temperature which is lower than an oxygen-trap temperature ($T_{trap}$), but higher than a temperature which is lower by 100° C. than said oxygen-trap temperature ($T_{trap}$−100° C.), said ultra-high vacuum being maintained prior to the deposition of said first film.

2. The process set forth in claim 1 wherein deposition of said bottom superconductor layer is carried out in an atmosphere of oxygen having the purity of higher than 5N (99.999%).

3. The process set forth in claim 1 wherein deposition of oxygen-containing films to be deposited also is carried out in an atmosphere of oxygen having the purity of higher than 5N (99.999%).

4. the process set forth in claim 1 wherein said bottom superconductor layer is a c-axis oriented film of $YBa_2Cu_3$ oxide.

5. The process set forth in claim 1 wherein said first film is made of non-superconductor.

6. The process set forth in claim 5 wherein said non-superconductor is an oxide or a metal.

7. The process set forth in claim 1 wherein a second film to be deposited on said first film is a top superconductor layer of $YBa_2Cu_3$ oxide.

8. The process set forth in claim 1 wherein said substrate is a single crystal.

9. The process set forth in claim 2 wherein said bottom superconductor layer is a c-axis oriented film of $YBa_2Cu_3$ oxide.

10. The process set forth in claim 9 wherein said first film is deposited on said bottom superconductor layer after the temperature of said bottom superconductor layer is adjusted between 350° and 400° C.

11. A process for depositing successively a plurality of films on a bottom superconductor layer made of a $YBa_2Cu_3$ oxide superconductor deposited on a substrate, wherein the deposition of said films is carried out in a single chamber successively, prior to deposition of a first film to be deposited directly on said bottom $YBa_2Cu_3$ oxide superconductor layer, said chamber is evacuated lower than $10^{-9}$ Torr, and then said first film is deposited in an atmosphere of oxygen having a purity of higher than 5N (99.999%) at a temperature range of said bottom superconductor between a film forming temperature of said bottom superconductor layer and a temperature which is lower by 100° C. than the oxygen-trap temperature ($T_{trap}$) at which oxygen enter into said oxide superconductor ($T_{trap}$−100° C.).

12. The process set forth in claim 11 wherein the deposition of said bottom superconductor layer is carried out in an atmosphere of oxygen having the purity of higher than 5N (99.999%).

13. The process set forth in claim 11 wherein said bottom superconductor layer is a c-axis oriented thin film of a $YBa_2Cu_3$ oxide.

14. The process set forth in claim 11 wherein said first thin film is made of a non-superconductor.

15. The process set forth in claim 14 wherein said non-superconductor is an oxide or a metal.

16. The process set forth in claim 11 wherein a second thin film to be deposited on said first thin film is a top superconductor layer of a $YBa_2Cu_3$ oxide.

17. The process set forth in claim 11 wherein said substrate is a single crystal.

18. The process set forth in claim 11 wherein deposition of films to be deposited is carried out at a temperature of said bottom superconductor layer between 350° and 600° C.

* * * * *